US012796298B2

(12) United States Patent
Sakakibara

(10) Patent No.: US 12,796,298 B2
(45) Date of Patent: Nov. 10, 2026

(54) DISPLAY DEVICE

(71) Applicant: SHARP KABUSHIKI KAISHA, Sakai City (JP)

(72) Inventor: Yusuke Sakakibara, Sakai City (JP)

(73) Assignee: SHARP KABUSHIKI KAISHA, Sakai City (JP)

( * ) Notice: Subject to any disclaimer, the term of this patent is extended or adjusted under 35 U.S.C. 154(b) by 540 days.

(21) Appl. No.: 18/275,029

(22) PCT Filed: Feb. 4, 2021

(86) PCT No.: PCT/JP2021/004082
§ 371 (c)(1),
(2) Date: Jul. 31, 2023

(87) PCT Pub. No.: WO2022/168224
PCT Pub. Date: Aug. 11, 2022

(65) Prior Publication Data
US 2024/0090277 A1 Mar. 14, 2024

(51) Int. Cl.
*H10K 59/80* (2023.01)
*H10K 59/126* (2023.01)
*H10K 102/00* (2023.01)

(52) U.S. Cl.
CPC ....... *H10K 59/8791* (2023.02); *H10K 59/126* (2023.02); *H10K 59/8722* (2023.02); *H10K 59/8792* (2023.02); *H10K 59/8793* (2023.02); *H10K 2102/3026* (2023.02)

(58) Field of Classification Search
CPC ............. H10K 59/8791; H10K 59/126; H10K 59/8722; H10K 59/8792; H10K 59/8793; H10K 2102/3026; H05B 33/02; H05B 33/04; H05B 33/12; H05B 33/14; H05B 33/22
See application file for complete search history.

(56) References Cited

U.S. PATENT DOCUMENTS

2005/0225863 A1* 10/2005 Krasnov ............ H10K 59/8791 359/601
2014/0110690 A1* 4/2014 Yagi ..................... H10K 59/877 257/40
2016/0365393 A1* 12/2016 Kim ...................... H10K 77/111
2019/0165326 A1* 5/2019 Kim ...................... H10K 59/122

FOREIGN PATENT DOCUMENTS

JP 2010-085645 A 4/2010

* cited by examiner

*Primary Examiner* — Donald L Raleigh
(74) *Attorney, Agent, or Firm* — ScienBiziP, P.C.

(57) ABSTRACT

A display device includes: a light-emitting element provided on a substrate, and including a first electrode that reflects visible light, a second electrode that transmits visible light, and a light-emitting layer provided between the first electrode and the second electrode; a subpixel that is a light-emitting region in plan view of the light-emitting element; a polarizing plate provided on the light-emitting element disposed in a light emission direction in which light is emitted from the light-emitting element, the polarizing plate partially overlapping with the subpixel in plan view; and a light-blocking layer provided at least partially around the subpixel and raised higher in the light emission direction than the polarizing plate.

18 Claims, 12 Drawing Sheets

DISPLAY DEVICE

TECHNICAL FIELD

The present disclosure relates to a display device including a light-emitting element.

BACKGROUND ART

In recent years, display devices including such light-emitting elements as, for example, quantum-dot light-emitting diodes (QLEDs), or organic light-emitting diodes (OLEDs) have attracted widespread attention.

In these display devices, the light-emitting elements typically include reflective electrodes to release light from the light-emitting elements. The display devices have problems: the reflective electrodes reflect external light, which makes it difficult to see an image; and when the light-emitting elements do not emit light, it is difficult to present perfect black.

Patent Document 1 discloses a display device including OLEDs. Each OLED includes a light-blocking member and a polarizing plate to reduce reflection of external light caused by a reflective electrode.

CITATION LIST

Patent Literature

[Patent Document 1] Japanese Unexamined Patent Application Publication No. 2010-085645

SUMMARY

Technical Problem

However, in the display device described in Patent Document 1, the polarizing plates provided toward an observer are provided to the entire surface of the display region. Hence, all the light emitted from the light-emitting elements passes through the polarizing plates. The light emitted from the light-emitting elements is polarized randomly, and approximately half of the light emitted from the light-emitting elements is absorbed into the polarizing plates. A problem here is that the light to be released from the light-emitting elements inevitably decreases in intensity.

An aspect of the present disclosure is conceived in view of the above problem, and intended to provide a display device that reduces visibility of external light reflected on a reflective electrode and that releases much light from a light-emitting element.

Solution to Problem

In order to solve the above problem, a display device according to the present disclosure includes:

a light-emitting element provided on a substrate, and including a first electrode that reflects visible light, a second electrode that transmits visible light, and a light-emitting layer provided between the first electrode and the second electrode;

a subpixel that is a light-emitting region in plan view of the light-emitting element;

a polarizing plate provided on the light-emitting element disposed in a light emission direction in which light is emitted from the light-emitting element, the polarizing plate partially overlapping with the subpixel in plan view; and a light-blocking layer provided at least partially around the subpixel and raised higher in the light emission direction than the polarizing plate.

Advantageous Effect

An aspect of the present disclosure can provide a display device that reduces visibility of external light reflected on a reflective electrode (a first electrode) and that releases much light from a light-emitting element.

DESCRIPTION OF EMBODIMENTS

Described below are embodiments of the disclosure, with reference to FIGS. 1 to 18. For convenience in description, like reference signs designate identical constituent features throughout the embodiments. These constituent features will not be elaborated upon.

First Embodiment

Figure 1:
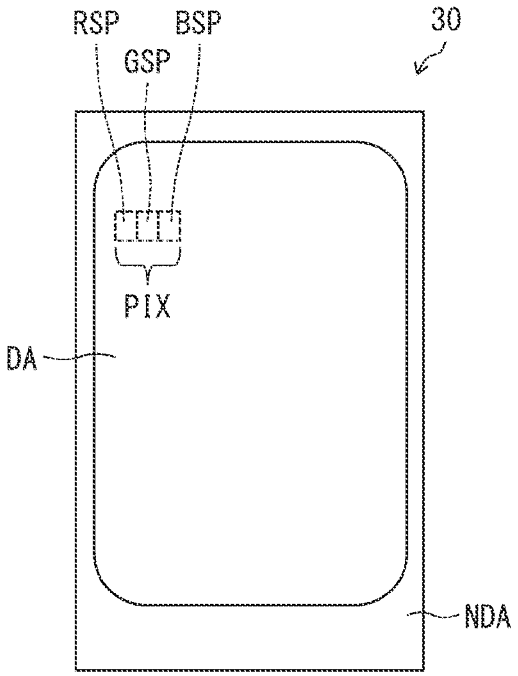
FIG. 1 is a plan view of a schematic configuration of a display device according to a first embodiment.

FIG. 1 is a plan view of a schematic configuration of a display device 30 according to a first embodiment.

As illustrated in FIG. 1, the display device 30 includes a picture-frame region NDA and a display region DA. The display region DA of the display device 30 includes a plurality of pixels PIX. Each of the pixels PIX includes a red subpixel RSP, a green subpixel GSP, and a blue subpixel BSP. This embodiment exemplifies a case where each pixel PIX includes the red subpixel RSP, the green subpixel GSP, and the blue subpixel BSP. However, this embodiment shall not be limited to such a case. For example, each pixel PIX may further include a subpixel in another color, in addition to the red subpixel RSP, the green subpixel GSP, and the blue subpixel BSP.

Figure 2:
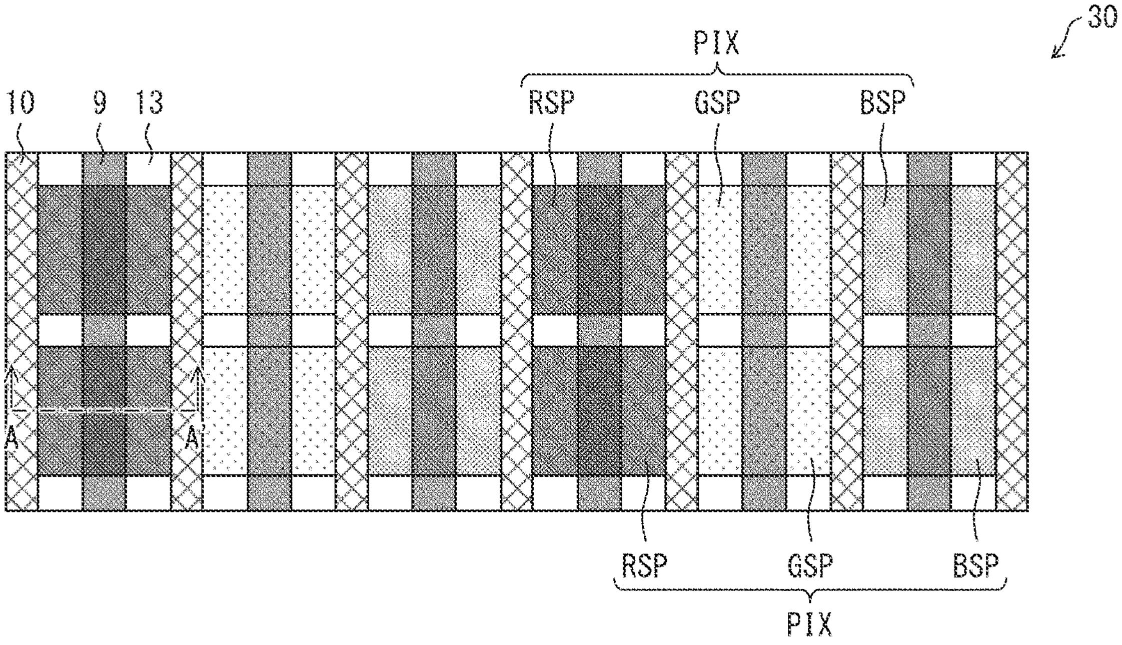
FIG. 2 is a plan view of a display region of the display device according to the first embodiment.

FIG. 2 is a plan view of the display region DA of the display device 30 according to the first embodiment.

As illustrated in FIG. 2, the display region DA of the display device 30 includes the plurality of pixels PIX. Each of the pixels PIX includes the red subpixel RSP, the green subpixel GSP, and the blue subpixel BSP.

The red subpixel RSP is a light-emitting region in plan view of a light-emitting element (a light-emitting element that emits a red light) to be described later. The green subpixel GSP is a light-emitting region in plan view of a light-emitting element (a light-emitting element that emits a green light) to be described later. The blue subpixel BSP is a light-emitting region in plan view of a light-emitting element (a light-emitting element that emits a blue light) to be described later.

The display region DA of the display device 30 illustrated in FIG. 2 is a surface (a display surface) of the display device 30 provided in a light emission direction in which light is emitted from a light-emitting element to be described later.

Figure 3:
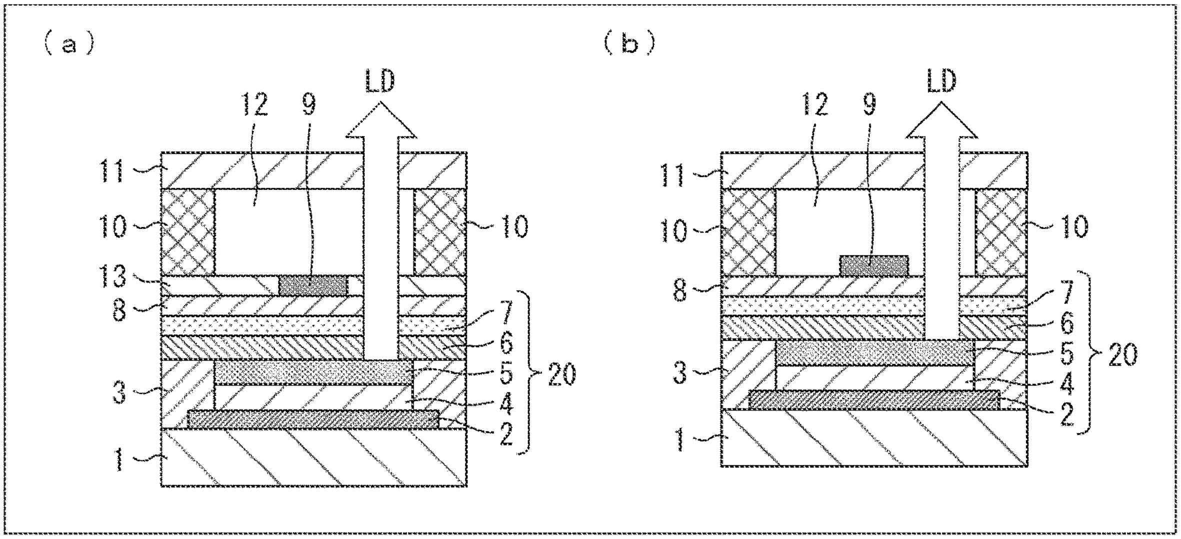
FIG. 3(*a*) is a cross-sectional view taken along line A-A' of the display device in FIG. 2, and FIG. 3(*b*) is a view of a modification of the display device according to the first embodiment.

FIG. 3(*a*) is a cross-sectional view taken along line A-A' of the display device 30 in FIG. 2.

As illustrated in FIG. 3(*a*), a light-emitting element 20 is provided on a substrate 1 including a transistor. The light-emitting element 20 includes: a first electrode 2 that reflects visible light, a second electrode 7 that transmits visible light, and a light-emitting layer 5 provided between the first electrode 2 and the second electrode 7. Note that a drain electrode of the transistor (not shown) included in the substrate 1 is electrically connected to the first electrode 2 that reflects visible light.

This embodiment exemplifies a case where the light-emitting element 20 includes: the first electrode 2 that reflects visible light and serves as an anode; the second electrode 7 that transmits visible light and serves as a cathode; the light-emitting layer 5 that serves as a light-emitting layer containing quantum dots (QDs); a hole transport layer 4 provided between the first electrode 2 and the light-emitting layer 5; and an electron transport layer 6 provided between the light-emitting layer 5 and the second electrode 7. However, the light-emitting element 20 shall not be limited to such a case. For example, the light-emitting element 20 may further include: a not-shown hole injection layer between the first electrode 2 and the hole transport layer 4; and a not-shown electron injection layer between the electron transport layer 6 and the second electrode 7. Furthermore, between the first electrode 2 and the light-emitting layer 5, at least one of the hole transport layer 4 or the not-shown hole injection layer may be omitted as appropriate. Between the light-emitting layer 5 and the second electrode 7, at least one of the electron transport layer 6 or the not-shown electron injection layer may be omitted as appropriate.

This embodiment exemplifies a case where the display device 30 includes the light-emitting element 20 of a top-emission type. However, the display device 30 shall not be limited to such a case. The display device 30 may include a bottom-emission light-emitting element. Such case will be described later in a seventh embodiment.

As illustrated in FIG. 3(*a*), if the light-emitting element 20 has a multilayer film of a forward-order stack structure; that is, when the anode, the hole transport layer 4, the light-emitting layer 5, the electron transport layer 6, and the cathode are stacked on top of another in this order from toward the substrate 1, the cathode is disposed above the anode. Hence, in order to form the light-emitting element 20 as a top-emission light-emitting element, the first electrode 2 reflective to visible light may serve as the anode, and the second electrode 7 transparent to visible light may serve as the cathode. Meanwhile, although not shown, if the light-emitting element 20 has a multilayer film of a reverse-order stack structure, that is, when the cathode, the electron transport layer 6, the light-emitting layer 5, the hole transport layer 4, and the anode are stacked on top of another in this order from toward the substrate 1, the anode is disposed above the cathode. Hence, in order to form the light-emitting element 20 as a top-emission light-emitting element, the first electrode 2 reflective to visible light may serve as the cathode, and the second electrode 7 transparent to visible light may serve as the anode. As described above, the light-emitting element 20 is a top-emission light-emitting element, and a light emission direction LD in which light is emitted from the light emitting element 20 is an upward direction as illustrated in FIG. 3(*a*).

This embodiment exemplifies a case where the display device 30 includes a bank 3. However, the display device 30 shall not be limited to such a case. The display device 30 may omit the bank 3. As illustrated in FIG. 3(*a*), the bank 3 is formed to cover an end portion of the first electrode 2. The hole transport layer 4 and the light-emitting layer 5 are provided in a region above the first electrode 2 and surrounded with the bank 3.

The light-emitting element 20 has a light-emitting region in plan view, and the light-emitting region in plan view is determined in accordance with a region in which the first electrode 2, the light-emitting layer 5, and the second electrode 7 overlap with one another in plan view. In the case of the light-emitting element 20, the light-emitting layer 5 is smaller in size than the first electrode 2 or the second electrode 7. Hence, the size of the light-emitting layer 5 determines the light-emitting region of the light-emitting element 20 in plan view.

The substrate 1 includes: a support substrate; a transistor (not shown) for driving the light-emitting element 20; a wire electrically connected to each electrode of the transistor, and various insulating films. The support substrate may be either, for example, a resin substrate formed of polyimide, or a glass substrate.

The first electrode 2 that reflects visible light can be formed of an electrode material that reflects visible light. The electrode material that reflects visible light may be any given material as long as the material can reflect visible light and conduct electricity. An example of the electrode material includes: a metal material such as Al, Mg, Li, or Ag; an alloy of the metal materials; a multilayer stack of the metal material and a transparent metal oxide (for example, indium tin oxide, indium zinc oxide, or indium gallium zinc oxide); or a multilayer stack of the alloy and the transparent metal oxide.

Meanwhile, the second electrode 7 that transmits visible light can be formed of an electrode material that transmits visible light. The electrode material that transmits visible light may be any given material as long as the material can transmit visible light and conduct electricity. An example of the electrode material includes a thin film formed of, for example, either: a transparent metal oxide (for example, indium tin oxide, indium zinc oxide, or indium gallium zinc oxide); or a metal material formed of Al, Mg, Li, or Ag.

The bank 3 can be formed of such an organic material as, for example, photosensitive polyimide or photosensitive acrylic. The organic material is applied and, after that, patterned by photolithography to form the bank 3.

The hole transport layer 4 may be formed of any given material as long as the material is a hole-transporting material capable of stably transporting holes into the light-emitting layer 5. In particular, the hole-transporting material exhibits preferably high hole mobility. Furthermore, the hole-transporting material is preferably a material (an electron blocking material) capable of preventing penetration of electrons moving from the cathode.

The not-shown hole injection layer may be formed of any given material as long as the material is a hole injection material capable of stably injecting the holes into the light-emitting layer 5.

This embodiment exemplifies a case where the light-emitting layer 5 contains quantum dots (QDs); that is, the light-emitting layer 5 is a light-emitting layer designed for QLEDs. However, the light-emitting layer 5 shall not be limited to such a case. The light-emitting layer 5 is, for example, a light-emitting layer formed by evaporation and designed for OLEDs.

This embodiment exemplifies a case where the display device 30 includes QLEDs alone as light-emitting elements. However, the display device 30 shall not be limited to such a case. The display device 30 may include at least QLEDs or OLEDs.

A red subpixel RSP illustrated in FIG. 2 is a light-emitting region in plan view of a light-emitting element including a light-emitting layer emitting a red light. A green subpixel GSP illustrated in FIG. 2 is a light-emitting region in plan view of a light-emitting element including a light-emitting layer emitting a green light. A blue subpixel BSP illustrated in FIG. 2 is a light-emitting region in plan view of a light-emitting element including a light-emitting layer emitting a blue light.

The light-emitting layer 5 containing quantum dots (QDs), and formed in the configuration below, can serve as, for example, any one of a light-emitting layer emitting a red light, a light-emitting layer emitting a green light, and a light-emitting layer emitting a blue light. In order for the light-emitting element 20, which includes the light-emitting layer 5 containing quantum dots (QDs), to emit light in different colors, the light-emitting layer 5 may be formed of cores made of the same material and having different particle sizes. For example, cores having the largest particle size may be used for a light-emitting layer that emits a red light. Cores having the smallest particle size may be used for a light-emitting layer that emits a blue light. Cores having a particle size between the particle sizes of the cores used for the light-emitting layer that emits the red light and for the light-emitting layer that emits the blue light may be used for a light-emitting layer that emits a green light. In order for the light-emitting element 20, which includes the light-emitting layer 5 containing quantum dots (QDs), to emit light in different colors, the light-emitting layer 5 may be formed of cores made of different materials.

The electron transport layer 6 may be formed of any given material as long as the material is an electron-transporting material capable of transporting the electrons injected from the cathode into the light-emitting layer 5. In particular, the electron-transporting material exhibits preferably high electron mobility. Furthermore, the electron-transporting material is preferably a material (a hole blocking material) capable of preventing penetration of holes moving from the anode. Such a feature can increase efficiency in recombination of the holes and the electrons in the light-emitting layer 5.

The not-shown electron injection layer may be formed of any given material as long as the material is an electron-injecting material capable of stably injecting the electrons into the light-emitting layer 5.

This embodiment exemplifies a case where, as illustrated in FIG. 3(*a*), the display device 30 includes a quarter-wave plate 8 provided throughout the display region DA between the light-emitting element 20 and the polarizing plate 9. However, the display device 30 shall not be limited to such a case. For example, the quarter-wave plate 8 is provided between the light-emitting element 20 and the polarizing plate 9 to overlap at least with the polarizing plate 9 in plan view. Note that the quarter-wave plate 8 may be omitted as appropriate.

The quarter-wave plate 8 can achieve the following feature. External light passes through the polarizing plate 9 to be polarized light. After that, the polarized light passes through the quarter-wave plate 8, and is reflected on the first electrode 2 that reflects visible light. After that, when the polarized light passes through the quarter-wave plate 8 again, the quarter-wave plate 8 can prevent the polarized light from passing through the polarizing plate 9. Such a feature can reduce visibility of the external light reflected on the first electrode 2 that reflects visible light.

Note that the polarizing plate 9 alone can reduce the amount of external light polarized randomly and incident on the first electrode 2 included in the light-emitting element 20 and reflective to visible light. Such a feature can reduce visibility of the external light reflected on the first electrode 2 that reflects visible light.

The quarter-wave plate 8 may be formed by any given manner. For example, the quarter-wave plate 8 may be attached or applied.

As illustrated in FIG. 2 and FIG. 3(*a*), the display device 30 includes the polarizing plate 9 provided on the light-emitting element 20 disposed in the light emission direction LD in which light is emitted from the light-emitting element 20. The polarizing plate 9 partially overlaps with each of the red subpixel RSP, the green subpixel GSP, and the blue subpixel BSP in plan view. Furthermore, the light-blocking layer 10 is provided at least partially around each of the red subpixel RSP, the green subpixel GSP, and the blue subpixel BSP. The light-blocking layer 10 is raised higher in the light emission direction LD than the polarizing plate 9.

According to the above configuration, the polarizing plate 9 is provided to partially overlap with each of the red subpixel RSP, the green subpixel GSP, and the blue subpixel BSP in plan view. Hence, in plan view, the polarizing plate 9 does not overlap with the remaining portion of each of the red subpixel RSP, the green subpixel GSP, and the blue subpixel BSP. As a result, much light can be released from the remaining portion of each of the red subpixel RSP, the green subpixel GSP, and the blue subpixel BSP. Furthermore, the light-blocking layer 10 can reduce incoming external light. Such a feature can reduce reflection of external light on the first electrode 2. Moreover, the light-blocking layer 10 can block external light reflected on the first electrode 2. Such a feature can reduce visibility of the external light reflected on the first electrode 2. In addition, the polarizing plate 9 can reduce reflection of external light on the first electrode 2 and reduce visibility of the reflected external light on the first electrode 2.

Thanks to such features, the display device 30 can reduce visibility of external light reflected on the first electrode 2 and release much light from the light-emitting element 20.

This embodiment exemplifies a case where, as illustrated in FIG. 2 and FIG. 3(*a*), the light-blocking layer 10 is formed to include a first light-blocking wall formed linearly and a second light-blocking wall formed linearly, and the first light-blocking wall and the second light-blocking wall are formed respectively along a left side and a right side; namely, two opposing sides of each of the red subpixel RSP, the green subpixel GSP, and the blue subpixel BSP. However, the light-blocking layer 10 shall not be limited to such a case. Note that the two opposing sides of each of the red subpixel RSP, the green subpixel GSP, and the blue subpixel BSP may be upper sides or lower sides.

Thanks to the above configuration, the light-blocking layer 10 includes a portion formed linearly. Such a feature allows the polarizing plate 9 to be formed by a technique other than patterning; that is, for example, attaching a linear polarizing plate.

In this embodiment, as illustrated in FIG. 2 and FIG. 3(*a*), the polarizing plate 9 includes a linear portion positioned intermediately between the first light-blocking wall and the second light-blocking wall of the light-blocking layer 10. The linear portion is formed apart from the light-blocking layer 10.

The light-emitting element 20 of this embodiment is produced by application of a light-emitting material containing a solvent and quantum dots (QDs) dispersed in the solvent. As to such a light-emitting element, if the light-emitting layer 5 is formed thicker in a peripheral portion than in a center portion because of surface tension of the solvent, luminance of emitted light is likely to be higher in a peripheral portion than in a center portion of each of the red subpixel RSP, the green subpixel GSP, and the blue subpixel BSP. Thanks to such a configuration, the polarizing plate 9 is provided to overlap in plan view with the center portion of each of the red subpixel RSP, the green subpixel GSP, and the blue subpixel BSP. In the case of a display device whose luminance of emitted light is lower in the center portion than in the peripheral portion of each of the red subpixel RSP, the green subpixel GSP, and the blue subpixel BSP, much light can be released from the light-emitting element 20.

The polarizing plate 9 may be, for example, attached. As will be described later, the polarizing plate 9 may be formed by application, exposure to light, development, and patterning. The polarizing plate 9 may be formed by any given technique.

The light-blocking layer 10 may be formed of a light-blocking material. This embodiment exemplifies a case where the light-blocking layer 10 contains a material absorbing visible light. However, the light-blocking layer 10 may be formed of any given material. An example of the material absorbing visible light includes, but not limited to, carbon black. In this embodiment, the light-blocking layer 10 is formed, for example, as follows. A negative photosensitive resin, which contains a sufficient amount of carbon black to shield light, is applied, exposed to light, and developed to form the light-blocking layer 10 having a predetermined shape and height.

If the light-blocking layer 10 contains a material that absorbs visible light, the light-blocking layer 10 can further reduce reflection of external light on the first electrode 2 and further reduce visibility of the external light reflected on the first electrode 2.

This embodiment exemplifies a case where, as illustrated in FIG. 3(*a*), a transparent plate 13 is provided on the light-emitting element 20 to surround the polarizing plate 9, and the light-blocking layer 10 is provided on the transparent plate 13. However, this embodiment shall not be limited to such a case.

According to the above configuration, the light emitting element 20 has an upper portion, other than the polarizing plate 9, covered with the transparent plate 13. Such a feature can improve reliability of the display device 30.

FIG. 3(*b*) is a view of a modification of the display device 30 according to the first embodiment.

As illustrated in FIG. 3(*b*), the light-blocking layer 10 may be provided on the quarter-wave plate 8, throughout the display region DA, between the light-emitting element 20 and the polarizing plate 9.

This embodiment exemplifies a case where, as illustrated in FIG. 3(*a*) and FIG. 3(*b*), the light-blocking layer 10 is provided to overlap at least partially with the bank 3 in plan view. However, the light-blocking layer 10 shall not be limited to such a case.

According to the above configuration, the light-blocking layer 10 does not overlap with each of the red subpixel RSP, the green subpixel GSP, and the blue subpixel BSP in plan view. Such a feature makes it possible to release much light from the light-emitting element 20.

In this embodiment, as illustrated in FIG. 3(*a*) and FIG. 3(*b*), a sealing layer 12 is provided to cover the polarizing plate 9, and to thoroughly overlap at least with each of the red subpixel RSP, the green subpixel GSP, and the blue subpixel BSP. The sealing layer 12 can be formed of, for example, nitrogen or air to have a refractive index n of 1. Note that if the sealing layer has a refractive index n of more than 1, such a case will be described later in a second embodiment.

Note that, if the light-blocking layer 10 and a sealing glass 11 can seal a gas forming the sealing layer 12, a step of attaching the sealing glass 11 to the light-blocking layer 10 is carried out in, for example, a nitrogen atmosphere. Hence, the sealing layer 12 can be formed of nitrogen. On the other hand, if neither the light-blocking layer 10 nor the sealing glass 11 can seal the gas forming the sealing layer 12, the sealing layer 12 is formed of air. According to the configuration, the sealing layer 12 having a refractive index n of 1 can be provided in the light emission direction LD in which light is emitted from the light-emitting element 20.

Figure 4:
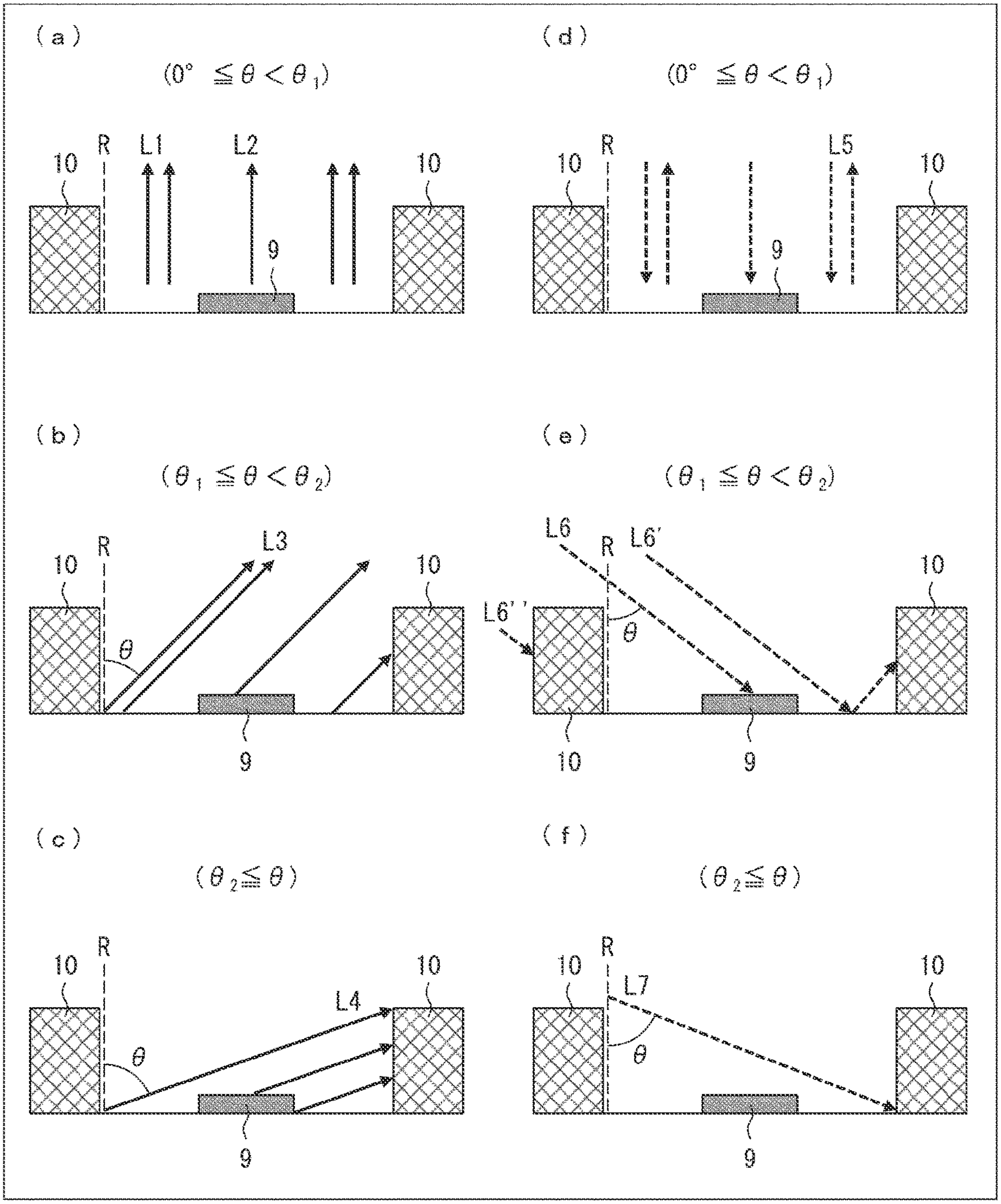
FIG. 4(*a*), FIG. 4(*b*), FIG. 4(*c*), FIG. 4(*d*), FIG. 4(*e*), and FIG. 4(*f*) are diagrams for showing the reason why the display device according to the first embodiment and the modification of the display device according to the first embodiment can reduce visibility of reflecting external light and release much light from a light-emitting element.

FIG. 4(*a*), FIG. 4(*b*), FIG. 4(*c*), FIG. 4(*d*), FIG. 4(*e*), and FIG. 4(*f*) are diagrams for showing the reason why the display device 30 and the modification of the display device 30 can reduce visibility of reflecting external light and release much light from the light-emitting element 20. Note that, in FIG. 4(*a*) to FIG. 4(*f*), $\theta_1$ is, for example, 40°, and $\theta_2$ is, for example, 70°.

Furthermore, in FIG. 4(*a*) to FIG. 4(*f*), when any given point of each subpixel RSP, GSP, and BSP, which is a light emitting region of the light-emitting element 20 in plan view, is set as an origin, φ is any given angle, on a plane passing through the origin, with respect to a first axis on the plane, and θ is any given angle with respect to a second axis R perpendicular to the first axis in a vertical direction from each subpixel RSP, GSP, and BSP.

As illustrated in FIG. 4(*a*), if a user views the display region DA of the display device 30 at the angle θ with respect to the second axis R, and the angle θ is within a range of $0° \leq \theta < \theta_1$ (if the user views the display region DA from the front), light emitted from the light-emitting element 20 includes light L1 passing through a portion without the polarizing plate 9, as well as light L2 passing through the polarizing plate 9. Such a feature allows much light to be released from the light-emitting element 20.

As illustrated in FIG. 4(*b*), if the user views the display region DA of the display device 30 at the angle θ with respect to the second axis R, and the angle θ is within a range of $\theta_1 \leq \theta < \theta_2$ (if the user views the display region DA at a slight angle), light L3 emitting from the light-emitting element 20 includes light whose angle θ is relatively small. Such light with small angle θ can be released more from the light-emitting element 20. On the other hand, the light L3 emitted from the light-emitting element 20 includes light whose angle θ is relatively large. Such light with large angle θ can be blocked with the light-blocking layer 10, and the amount of light emitted from the light-emitting element 20 decreases.

As illustrated in FIG. 4(*c*), if a user views the display region DA of the display device 30 at the angle θ with respect to the second axis R, and the angle θ is within a range of $\theta_2 \leq \theta$ (if the user views the display region DA at an angle), light L4 emitted from the light-emitting element 20 is blocked with the light-blocking layer 10. Hence, the user cannot view an image on the display region DA.

As can be seen, the display device 30 can release much light from the light-emitting element 20, in particular in the front.

As illustrated in FIG. 4(*d*), if the user views the display region DA of the display device 30 at the angle θ with respect to the second axis R, and the angle θ is within a range of $0° \leq \theta < \theta_1$ (if the user views the display region DA from the front), external light includes light L5 reflected on the first electrode 2 that reflects visible light. Because the light L5 passes through a portion without the polarizing plate 9, the display region DA is visible. However, if the user is present in front as described above, the user is unlikely to be a light source of the external light. Such a case does not have to be considered.

As illustrated in FIG. 4(*e*), if the user views the display region DA of the display device 30 at the angle θ with respect to the second axis R, and the angle θ is within a range of $\theta_1 \leq \theta < \theta_2$ (if the user views the display region DA at a slight angle), external light L6 is incident on a portion provided with the polarizing plate 9. Hence, the polarizing plate 9 can reduce light included in the external light L6 and reflected on the first electrode 2 that reflects visible light. External light L6' is incident on a portion without the polarizing plate 9, and reflected on the first electrode 2 that reflects visible light. Hence, the light-blocking layer 10 can reduce the external light L6'. External light L6" is incident on the light-blocking layer 10. Hence, the light-blocking layer 10 can reduce the external light L6".

As illustrated in FIG. 4(*f*), if the user views the display region DA of the display device 30 at the angle θ with respect to the second axis R, and the angle θ is within a range of $\theta_2 \leq \theta$ (if the user views the display region DA at an angle), external light L7 is blocked with the light-blocking layer 10. Hence, the light-blocking layer 10 can reduce reflection of the external light on the first electrode 2 that reflects visible light.

As can be seen, the display device 30 can reduce reflection of external light on the first electrode 2 that reflects visible light. Such a feature can reduce visibility of external light reflected on the first electrode 2 that reflects visible light.

As to the display device 30 of this embodiment, the region in which the polarizing plate 9 is provided is preferably determined as follows.

When any given point of each subpixel RSP, GSP, and BSP, which is a light-emitting region of the light-emitting element 20 in plan view, is set as an origin, φ is any given angle, on a plane passing through the origin, with respect to the first axis on the plane, and θ is any given angle with respect to the second axis R perpendicular to the first axis in a vertical direction from each subpixel RSP, GSP, and BSP. When the angle φ varies within a range of 0° or more and 360° or less, and the light the angle θ of which varies within a range of 0° or more and 60° or less is emitted toward each subpixel RSP, GSP, and BSP, the light-blocking layer 10 preferably creates a shadow region on each subpixel RSP, GSP, and BSP, and the polarizing plate 9 is provided in a region preferably out of the shadow region.

As can be seen, if the region in which the polarizing plate 9 is provided is determined, the polarizing plate 9 can be provided only in a region where the polarizing plate 9 works effectively. Such a feature allows the display device 30 to further release much light toward the front.

Figure 5:
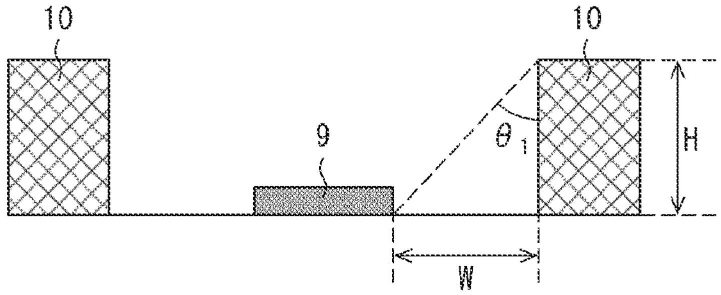
FIG. 5 is a diagram showing a relationship, in the display device according to the first embodiment, between a height of a light-blocking layer and a region where a polarizing plate is provided.

FIG. 5 is a diagram showing a relationship, in the display device 30 according to the first embodiment, between a height H of the light-blocking layer 10 and a region where a polarizing plate is provided.

When H represents a height of the light-blocking layer 10, and W represents a length of a longest line among lines: on a plane on which the light-blocking layer 10 is formed; perpendicular to the light-blocking layer 10 and the polarizing plate 9; and between the light-blocking layer 10 and the polarizing plate 9, the height H of the light-blocking layer 10 and the length W of the longest line are preferably determined so that $\theta_1 \leq 45°$ is satisfied where $\theta_1$ is defined as $\tan \theta_1 = W/H$ and $0° < \theta_1 < 90°$.

When the longest line W and the height H of the light-blocking layer 10 are determined to satisfy $\theta_1 \leq 45°$, if the user views the display region DA of the display device 30 at the angle θ with respect to the second axis R, and the angle θ is within a range of $0° \leq \theta < \theta_1$ where $\theta_1 \leq 45°$ holds (if the user views the display region DA from the front), the user is positioned in the front, and it is unlikely that the external light enters. Such a feature can reduce reflection of external light close to the front.

Figure 6:
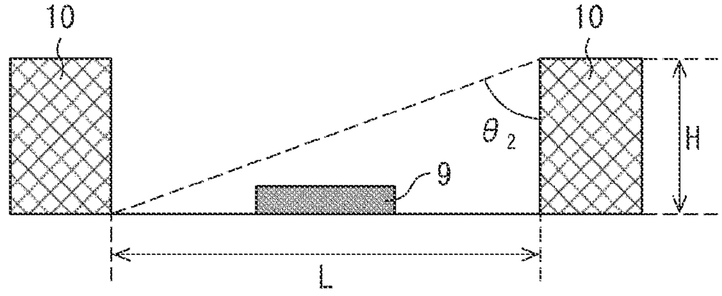
FIG. 6 is a diagram showing a relationship, in the display device according to the first embodiment, between a height of the light-blocking layer and a size of a subpixel.

FIG. 6 is a diagram showing a relationship, in the display device 30 according to the first embodiment, between the height H of the light-blocking layer 10 and a size of each subpixel RSP, GSP, and BSP.

When H represents a height of the light-blocking layer 10, and L represents a width, of each subpixel RSP, GSP, and the BSP, on a plane where the light-blocking layer 10 is formed, and the width is perpendicular to the light-blocking layer 10, the height H of the light-blocking layer 10 and the width L of each subpixel RSP, GSP, and BSP are preferably determined so that $\theta_2 \leq 60°$ is satisfied where $\theta_2$ is represented as $\tan \theta_2 = L/H$ and $0° < \theta_2 < 90°$.

When the height H of the light-blocking layer 10 and the width L of each subpixel RSP, GSP, and BSP are determined to satisfy $\theta_2 \leq 60°$, the display region DA can be viewed if the angle θ, of the light emitted from the light-emitting element 20, with respect to the second axis R is within a range of at least 0° to 60°.

In this embodiment, the height H of the light-blocking layer 10 is set to 36 μm, the width L of each subpixel RSP, GSP, and BSP is set to 100 μm, and the length W of the longest straight line is set to 31 μm so that, for example, $\theta_1$ is set to 40° and $\theta_2$ is set to 70°.

Figure 7:
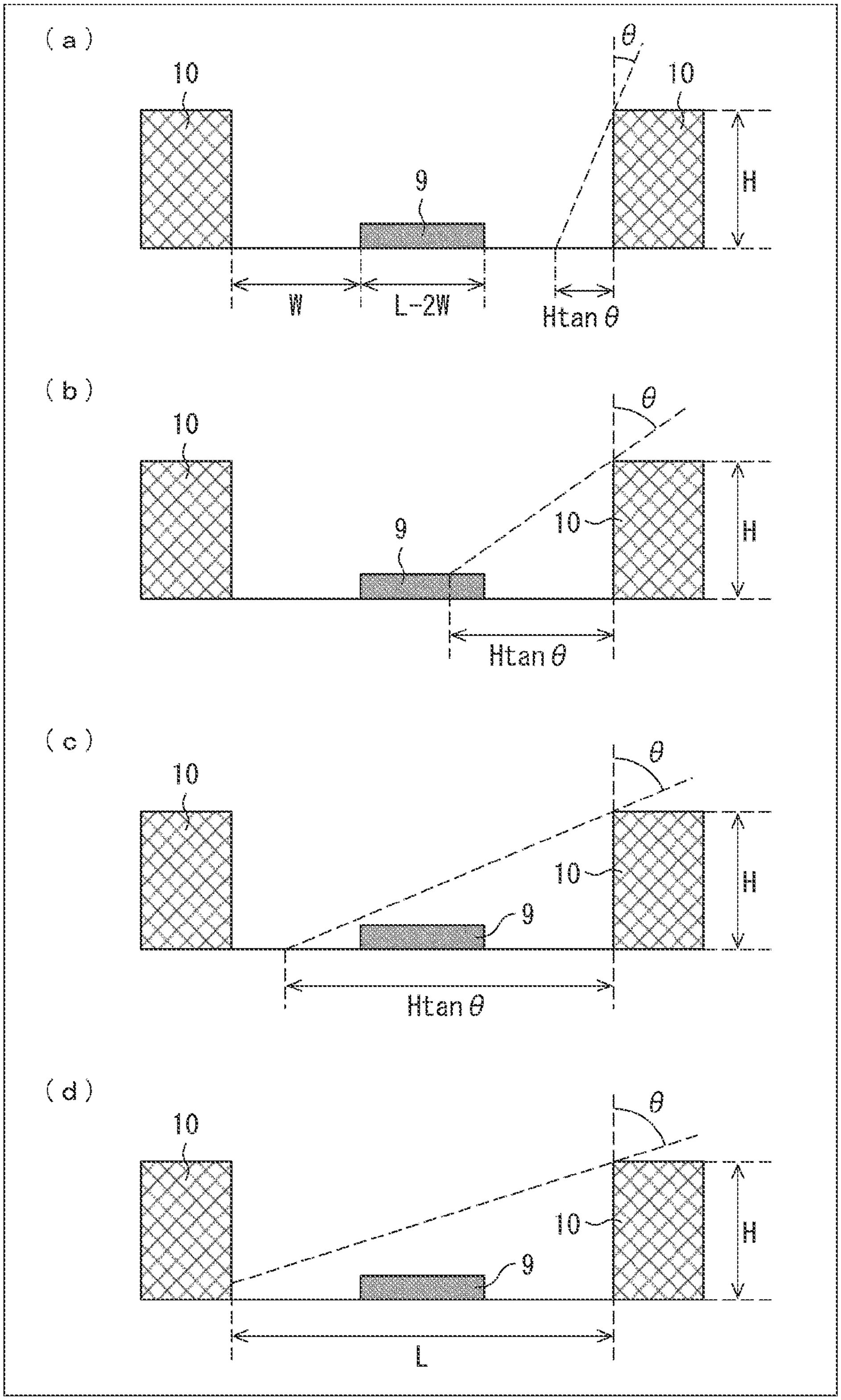
FIG. 7(*a*), FIG. 7(*b*), FIG. 7(*c*) and FIG. 7(*d*) are diagrams showing angular dependence of emission intensity of light released from a light-emitting element included in the display device according to the first embodiment.

FIG. 7(*a*), FIG. 7(*b*), FIG. 7(*c*) and FIG. 7(*d*) are diagrams showing angular dependence of emission intensity of light released from the light-emitting element 20 included in the display device 30 according to the first embodiment.

As illustrated in FIG. 7(*a*), if the user views the display region DA of the display device 30 at the angle θ with respect to the second axis R, and the angle θ is within a range of $0° \leq \theta < \theta_1$ (if the user views the display region DA from the front); that is, if $0 \leq \tan \theta \leq W/H$ holds, the emission intensity of the light-emitting element 20 is proportional to $W + r(L - 2W) + (W - H \tan \theta)$. Here, r represents a luminance of a region where the polarizing plate 9 is provided. If a luminance of a region where the polarizing plate 9 is not provided is 1, r is approximately 0.4.

As illustrated in FIG. 7(*b*), if the user views the display region DA of the display device 30 at the angle θ with respect to the second axis R, and the angle θ is relatively small and within a range of $\theta_1 \leq \theta < \theta_2$ (if the user views the display region DA at a slight angle); that is, if $W/H < \tan \theta \leq (L - W)$ holds, the emission intensity of the light-emitting element 20 is proportional to $W + r(L - W - H \tan \theta)$.

As illustrated in FIG. 7(*c*), if the user views the display region DA of the display device 30 at the angle θ with respect to the second axis R, and the angle θ is relatively large and within a range of $\theta_1 \leq \theta < \theta_2$ (if the user views the display region DA at a slight angle); that is, if $(L - W)/H < \tan \theta \leq L/H$ holds, the emission intensity of the light-emitting element 20 is proportional to $L - H \tan \theta$.

As illustrated in FIG. 7(*d*), if the user views the display region DA of the display device 30 at the angle θ with respect to the second axis R, and the angle θ is within a range of $\theta_2 \leq \theta \leq 90°$ (if the user views the display region DA at an angle); that is, if $(L - W)/H < \tan \theta \leq L/H$ holds, the emission intensity of the light-emitting element 20 is 0.

Figure 8:
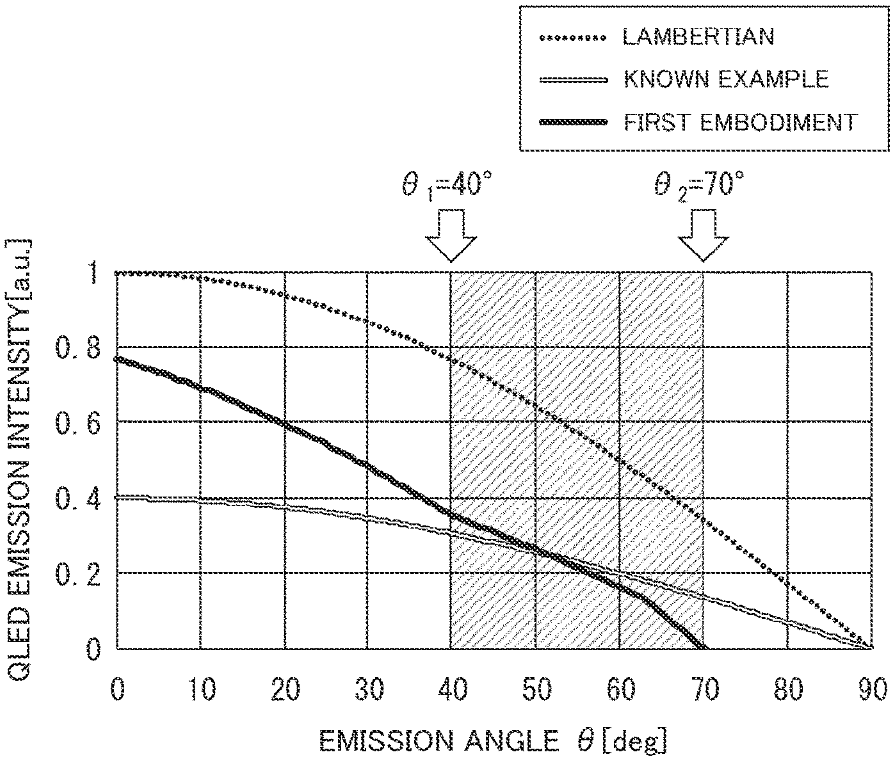
FIG. 8 is a graph showing emission intensity for each emission angle of the light released from the light-emitting element included in the display device according to the first embodiment.

FIG. 8 is a graph showing emission intensity for each emission angle of the light released from the light-emitting element 20 included in the display device 30 according to the first embodiment.

In a known example illustrated in FIG. 8, the polarizing plate 9 is provided throughout a display region of a display device, and the light-blocking layer 10 is omitted. The result is obtained when a Lambertian is multiplied by r times (=0.4) for all the emission angles.

In the case of the first embodiment illustrated in FIG. 8 (the display device 30 according to the first embodiment), more light is released from the light-emitting element 20, compared with the known example, when the emission angle θ is within a range of 0° to 50°. Furthermore, in the case of the first embodiment, less light is released from the light-emitting element 20, compared with the known example, when the emission angle θ is within a range of 51° to 70°. Moreover, in the case of the first embodiment, no light is released from the light-emitting element 20 when the emission angle θ is within a range of 71° to 90°.

As can be seen, the display device 30 is designed to release much light from the light-emitting element 20 particularly in the front. Furthermore, if a user views the display region DA of the display device 30 at the angle θ with respect to the second axis R, and the angle θ is within a range of 71° to 90°, the display region cannot be viewed. Hence, when the display device 30 is applied to, for example, a mobile display device, the display device can protect privacy of the user.

Figure 9:
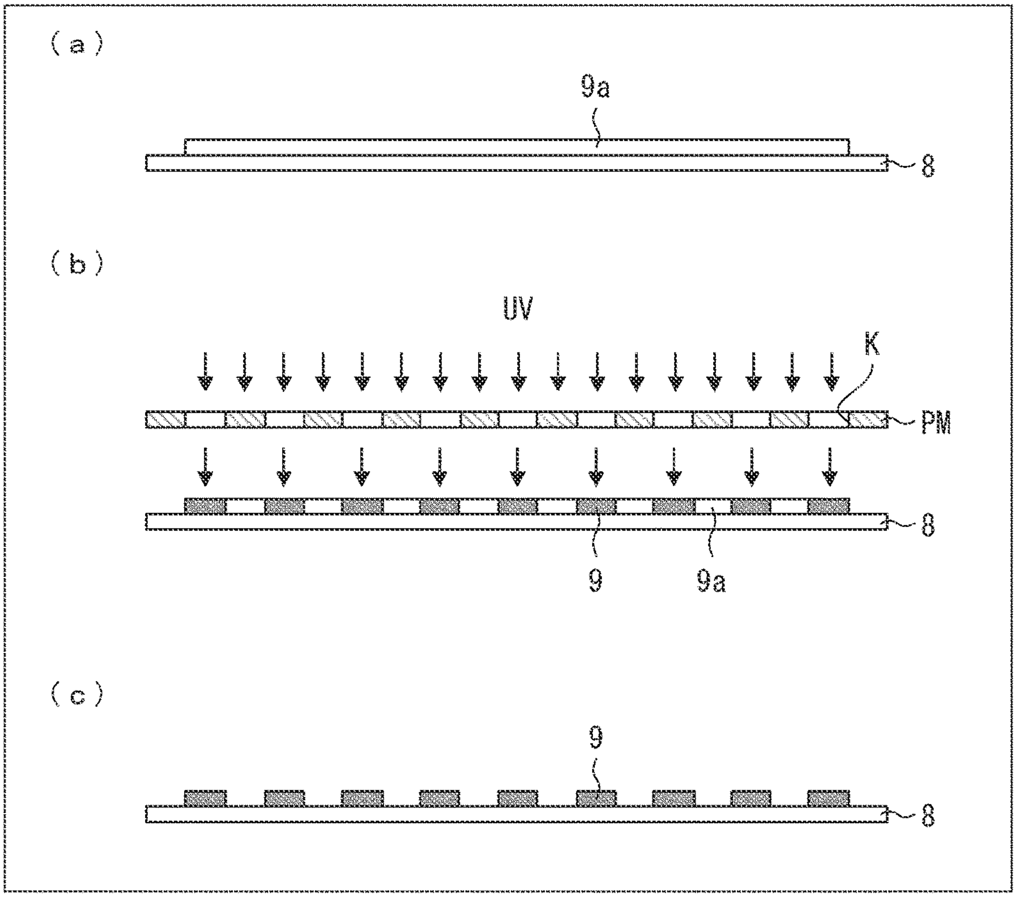
FIG. 9(*a*), FIG. 9(*b*), and FIG. 9(*c*) are views illustrating an example of steps of producing the polarizing plate included in the display device according to the first embodiment.

FIG. 9(*a*), FIG. 9(*b*), and FIG. 9(*c*) are views illustrating an example of steps of producing the polarizing plate 9 included in the display device 30 according to the first embodiment.

This embodiment exemplifies a case where the polarizing plate 9 is attached. However, the polarizing plate 9 shall not be limited to such a case, and may be formed as will be described below.

As illustrated in FIG. 9(*a*), for example, the quarter-wave plate 8 is coated with a polymerizable liquid crystal compound containing a dichroic dye, and then the solvent is dried and the polymerizable liquid crystal compound **9*a* is oriented. After that, as illustrated in FIG. 9**(*b*), a predetermined position of the polymerizable liquid crystal compound **9*a* is irradiated with an ultraviolet ray (UV) through an opening K of the photomask PM. A portion irradiated with the ultraviolet ray is polymerized to form the polarizing plate 9, and a portion not irradiated with the ultraviolet ray remains unpolymerized. After that, as illustrated in FIG. 9**(*c*), the polymerizable liquid crystal compound is cleaned with a solvent to form the polarizing plate 9 in a predetermined position.

Figure 10:
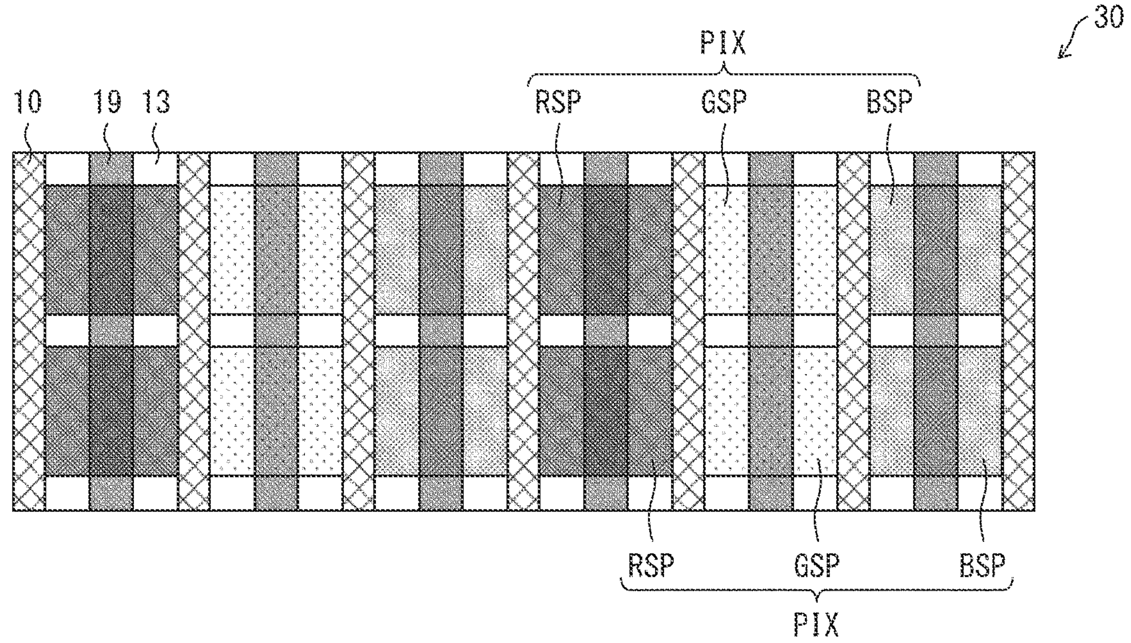
FIG. 10 is a view of how an inspection polarizing plate is placed on the display device according to the first embodiment.

FIG. 10 is a view of how an inspection polarizing plate 19 is placed on the display device 30 according to the first embodiment.

As illustrated in FIG. 10, for example, when the display device 30 is inspected, the inspection polarizing plate 19 whose polarization direction is orthogonal to that of the polarizing plate 9 is placed on the polarizing plate 9. Note that the inspection polarizing plate 19 is used only for shipping inspection, and preferably easily removable from the display device 30.

The inspection polarizing plate 19 placed on the polarizing plate 9 can block light emitted from a center portion of each subpixel RSP, GSP, and BSP. Such a feature allows for inspection of light emitted only from an outer edge other than the center portion of each subpixel RSP, GSP, and BSP. Note that the outer edge other than the center portion of each subpixel RSP, GSP, and BSP is likely to suffer unevenness in coating and thickness caused by, for example, the bank 3.

Second Embodiment

Described next is a second embodiment of the disclosure, with reference to FIGS. 11 to 13. A display device **30*a* of this embodiment differs from the display device 30 described in the first embodiment in that the display device 30*a* includes a sealing layer 14 made of resin or an inorganic film having a refractive index of more than 1, and omits the sealing glass 11. Otherwise, the display device 30***a* of this embodiment is the same as the display device 30 of the first embodiment. For convenience in description, like reference signs designate identical constituent features throughout the drawings between this embodiment and the first embodiment. These constituent features will not be elaborated upon.

Figure 11:
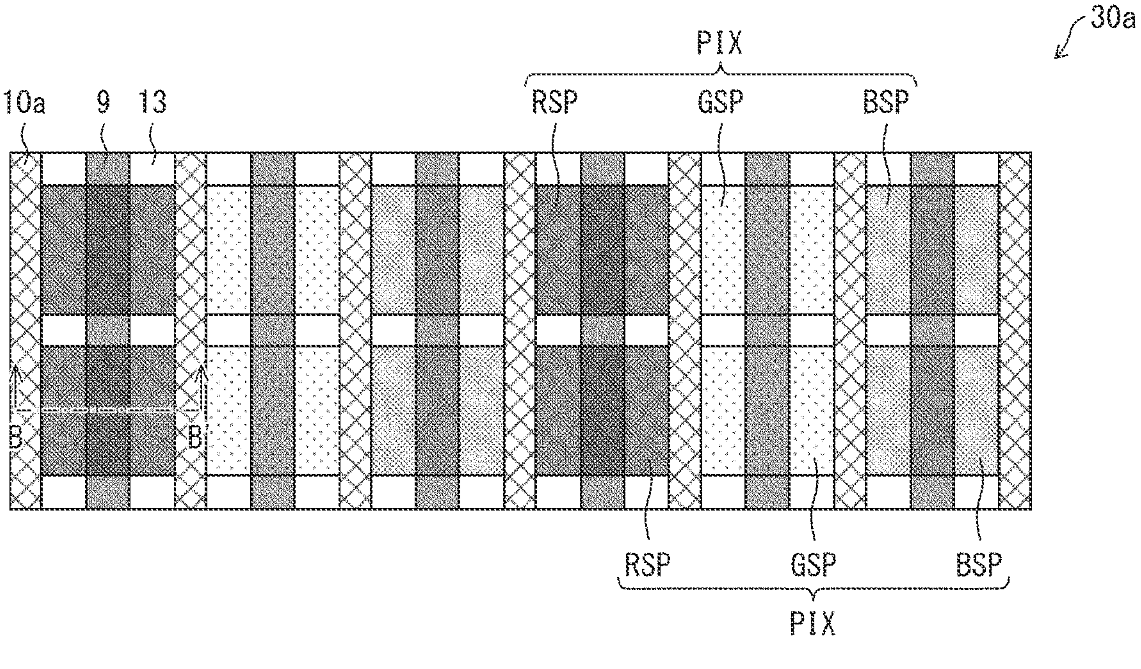
FIG. 11 is a plan view of a display region of a display device according to a second embodiment.

FIG. 11 is a plan view of the display region DA of the display device 30*a* according to the second embodiment.

Figure 12:
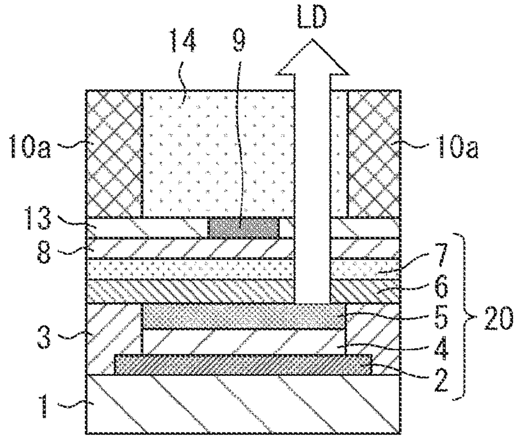
FIG. 12 is a cross-sectional view taken along line B-B' illustrated in FIG. 11.

FIG. 12 is a cross-sectional view taken along line B-B' illustrated in FIG. 11.

As illustrated in FIGS. 11 and 12, the display device 30*a* includes the sealing layer 14 covering the polarizing plate 9, and overlapping with at least all of the subpixels RSP, GSP, and BSP in plan view. Note that the sealing layer 14 is made of resin or an inorganic film having a refractive index n of more than 1. Examples of the resin having a refractive index n of more than 1 includes, but not limited to, acrylic resin and epoxy resin. Furthermore, examples of the inorganic film having a refractive index n of more than 1 include, but not limited to, a silicon oxide film and a silicon nitride film.

The display device 30*a* includes the sealing layer 14 made of resin or an inorganic film. The sealing layer 14 can improve reliability of the display device 30*a*.

Figure 13:
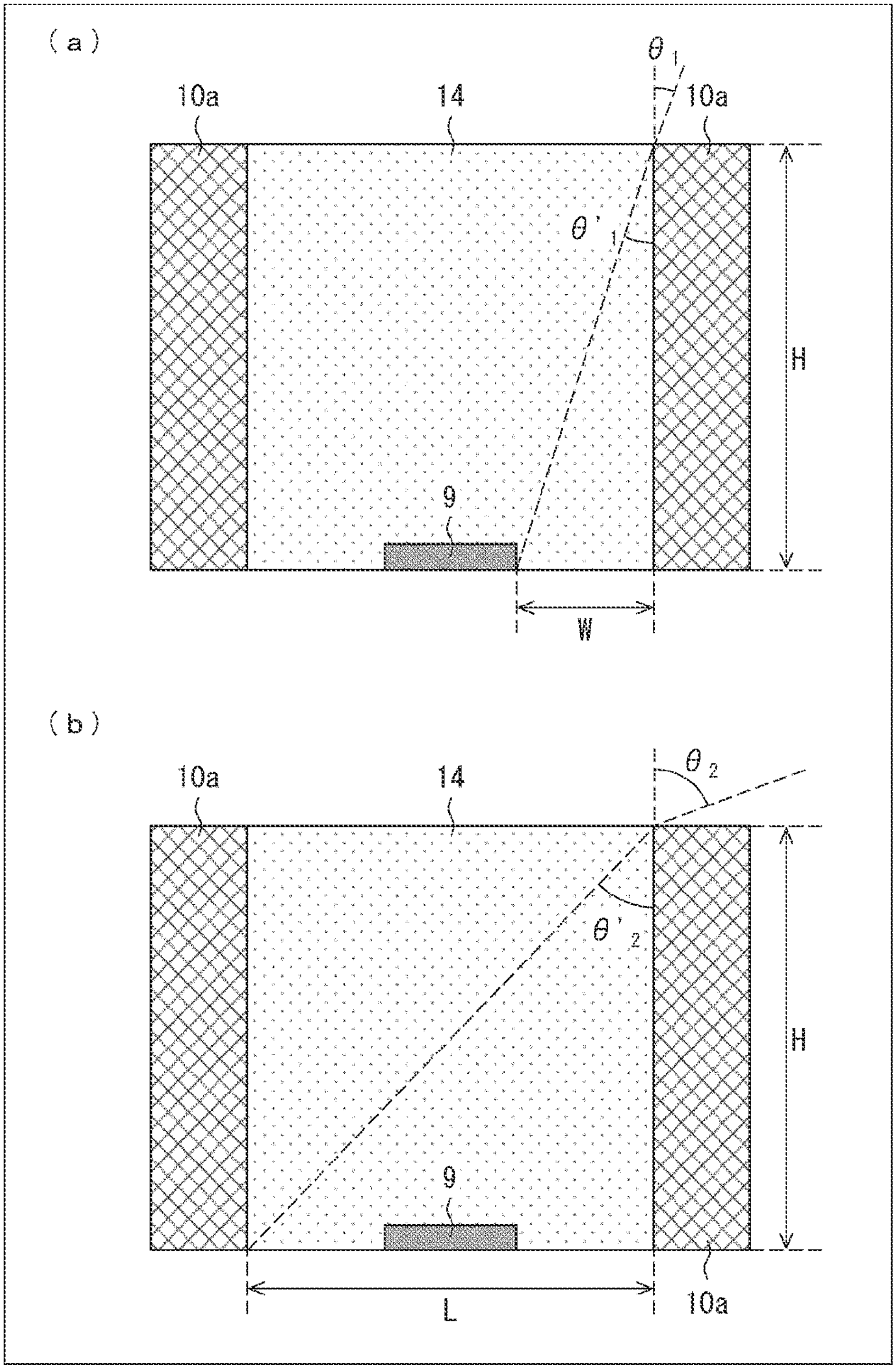
FIG. 13(*a*) is a diagram showing a relationship, in the display device according to the second embodiment, between a height of a light-blocking layer and a region where a polarizing plate is provided, and FIG. 13(*b*) is a diagram showing a relationship, in the display device according to the second embodiment, between a height of the light-blocking layer and a size of a subpixel.

FIG. 13(*a*) is a diagram showing a relationship, in the display device 30*a* according to the second embodiment, between a height H of a light-blocking layer 10*a* and a region where the polarizing plate 9 is provided, and FIG. 13(*b*) is a diagram showing a relationship, in the display device 30*a* according to the second embodiment, between the height H of the light-blocking layer 10*a* and a size of each subpixel RSP, GSP, and BSP.

As illustrated in FIG. 13(*a*), when n represents a refractive index of the sealing layer 14, H represents a height of the light-blocking layer 10*a*, and W represents a length of a longest line among lines: on a plane on which the light-blocking layer 10*a* is formed; perpendicular to the light-blocking layer 10*a* and the polarizing plate 9; and between the light-blocking layer 10*a* and the polarizing plate 9, the refractive index n of the sealing layer 14, the height H of the light-blocking layer 10*a*, and the length W of the longest line are preferably determined so that $\theta_1 \leq 45°$ is satisfied where $\theta_1$ is defined as $\sin \theta_1 = n * \sin \theta'_1$ and $0° < \theta_1 < 90°$ whereas $\theta'_1$ is defined as $\tan \theta'1 = W/H$ and $0° < \theta'_1 < 90°$.

When the refractive index n of the sealing layer 14, the height H of the light-blocking layer 10*a*, and the longest line W are determined to satisfy $\theta_1 \leq 45°$, if the user views the display region DA of the display device 30*a* at the angle θ with respect to the second axis R, and the angle θ is within a range of $0° \leq \theta < \theta_1$ where $\theta_1 \leq 45°$ holds (if the user views the display region DA from the front), the user is positioned in the front, and it is unlikely that the external light enters. Hence, external light reflected close to the front can be reduced.

As illustrated in FIG. 13(*b*), when n represents a refractive index of the sealing layer 14, H represents a height of the light-blocking layer 10*a*, and L represents a width, of each subpixel RSP, GSP, and the BSP, on a plane on which the light-blocking layer 10*a* is formed, and the width is perpendicular to the light-blocking layer 10*a*, the refractive index n of the sealing layer 14, the height H of the light-blocking layer 10*a*, and the width L of each subpixel RSP, GSP, and BSP are preferably defined so that $\theta_2 \leq 60°$ is satisfied where $\theta_2$ is defined as $\sin \theta_2 = n * \sin \theta'_2$ and $\theta° < \theta_2 < 90°$ whereas $\theta'_2$ is defined as $\tan \theta'2 = L/H$ and $0° < \theta'_2 < 90°$.

When the refractive index n of the sealing layer 14, the height H of the light-blocking layer 10*a*, and the width L of each subpixel RSP, GSP, and BSP are determined to satisfy $\theta_2 \leq 60°$, the display region DA can be viewed if the angle θ, of the light emitted from the light-emitting element 20, with respect to the second axis R is within a range of at least 0° to 60°.

While $\theta_2$ illustrated in FIG. 13(*b*) is maintained as $\theta_2$ in the first embodiment thanks to the refractive index n of the sealing layer 14, the height H of the light-blocking layer 10*a* can be increased. Accordingly, W illustrated in FIG. 13(*a*) can be increased, making it possible to release much light from the light-emitting element 20 in the front.

In this embodiment, the height H of the light-blocking layer 10*a* is set to 124 μm, the width L of each subpixel RSP, GSP, and BSP is set to 100 μm, and the length W of the longest straight line is set to 29 μm. Furthermore, the sealing layer 14 is formed of a material having a refractive index n of 1.5.

Note that $\theta'_1$ and $\theta'_2$ are smaller than a critical angle θc=42° where the sealing layer 14 has a refractive index n of 1.5, $\theta'_1$ is 13°, and $\theta'_2$ is 39°.

Third Embodiment

Described next is a third embodiment of the disclosure, with reference to FIG. 14. A display device 30*b* of this embodiment differs from the display devices 30 and 30*a* described in the first and second embodiments in that the display device 30*b* includes a light-blocking layer 10*b* including a plurality of island-shaped light-blocking walls surrounding only corners of the subpixels RSP, GSP, and BSP, and that a polarizing plate 9*a* is provided from a center of each subpixel RSP, GSP, and BSP to a plurality of end portions included in each subpixel RSP, GSP, and BSP and not covered with the light-blocking layer 10*b*. Otherwise, the display device 30*b* of this embodiment is the same as the display devices 30 and 30*a* of the first and second embodiments. For convenience in description, like reference signs designate identical constituent features throughout the drawings between this embodiment and the first and second embodiments. These constituent features will not be elaborated upon.

Figure 14:
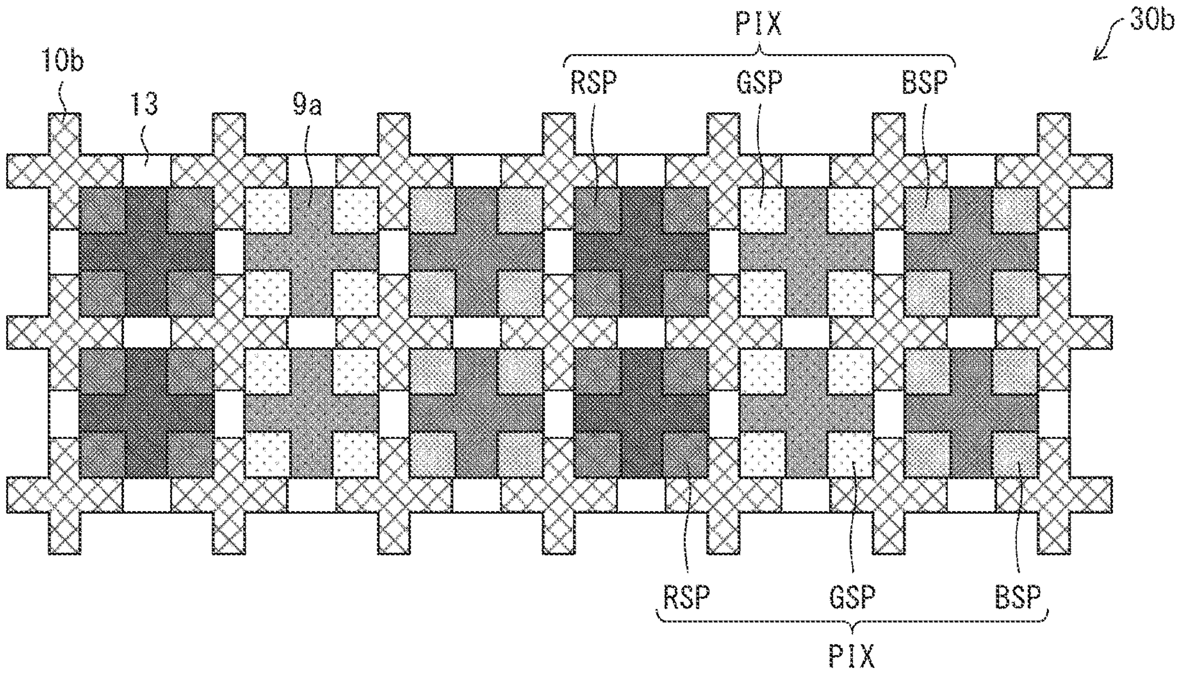
FIG. 14 is a plan view of a display region of a display device according to a third embodiment.

FIG. 14 is a plan view of the display region DA of the display device 30*b* according to the third embodiment.

As illustrated in FIG. 14, the light-blocking layer 10*b* included in the display device 30*b* includes a plurality of island-shaped light-blocking walls surrounding only the corners of the subpixels RSP, GSP, and BSP.

Thanks to the above feature, a space is formed between the plurality of island-shaped light-blocking walls. Utilizing such a space, the polarizing plate 9*a* can be provided by a method other than patterning. For example, the polarizing plate 9*a* may be formed linearly and attached.

As illustrated in FIG. 14, the polarizing plate 9*a* included in the display device 30*b* is provided from the center of each subpixel RSP, GSP, and BSP to a plurality of end portions included in each subpixel RSP, GSP, and BSP and not covered with the light-blocking layer 10*b*; that is, to a plurality of end portions included in each subpixel RSP, GSP, and BSP and not covered with a corresponding one of the plurality of island-shaped walls.

As illustrated in FIG. 14, the subpixels RSP, GSP, and BSP are formed in a rectangular shape, and the plurality of island-shaped light-blocking walls are provided to respective four corners of each subpixel RSP, GSP, and BSP in the rectangular shape.

Thanks to such a feature, the display device 30*b* can reduce visibility of external light reflected on the first electrode 2 in either the horizontal direction or the vertical direction, and release much light in the front. Furthermore, in the case of a display device whose luminance of emitted light is lower in the center portion than in the peripheral portion of each of the subpixel RSP, GSP, and BSP, much light can be released from the light-emitting element 20.

Fourth Embodiment

Described next is a fourth embodiment of the disclosure, with reference to FIG. 15. A display device 30*c* of this embodiment differs from the display devices 30, 30*a*, and 30*b* described in the first to third embodiments in that the display device 30*c* includes a light-blocking layer 10*c* formed to surround the subpixels RSP, GSP, and BSP. Otherwise, the display device 30*c* of this embodiment is the same as the display devices 30, 30*a*, and 30*b* of the first to third embodiments. For convenience in description, like reference signs designate identical constituent features throughout the drawings between this embodiment and the first to third embodiments. These constituent features will not be elaborated upon.

Figure 15:
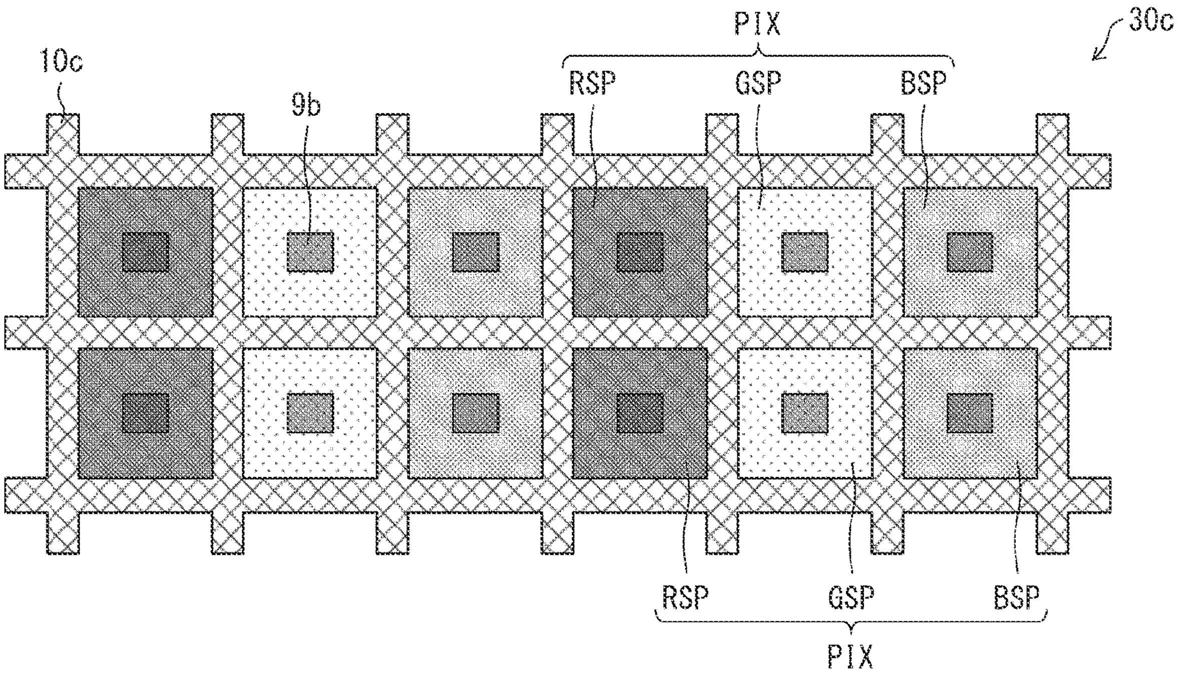
FIG. 15 is a plan view of a display region of a display device according to a fourth embodiment.

FIG. 15 is a plan view of the display region DA of the display device 30*c* according to the fourth embodiment.

As illustrated in FIG. 15, the light-blocking layer 10*c* included in the display device 30*c* is formed to surround the subpixels RSP, GSP, and BSP.

Thanks to such a feature, the display device 30*c* can reduce visibility of external light reflected on the first electrode 2 in either the horizontal direction or the vertical direction.

As illustrated in FIG. 15, the polarizing plate 9*b* included in the display device 30*c* is spaced apart from the light-blocking layer 10*c*, and overlaps with the center portion of each subpixel RSP, GSP, and BSP.

Thanks to such a feature, the display device 30*c* can reduce visibility of external light reflected on the first electrode 2 in either the horizontal direction or the vertical direction, and release much light in the front. Furthermore, in the case of a display device whose luminance of emitted light is lower in the center portion than in the peripheral portion of each of the subpixel RSP, GSP, and BSP, much light can be released from the light-emitting element 20.

Fifth Embodiment

Described next is a fifth embodiment of the disclosure, with reference to FIG. 16. A display device of this embodiment differs from the display devices 30, 30*a*, 30*b*, and 30*c* described in the first to fourth embodiments in that a light-blocking layer 10*d* has a material 15 formed on an upper surface of the bank 3 to absorb visible light. Otherwise, the display device of this embodiment is the same as the display devices 30, 30*a*, 30*b*, and 30*c* of the first to fourth embodiments. For convenience in description, like reference signs designate identical constituent features throughout the drawings between this embodiment and the first to fourth embodiments. These constituent features will not be elaborated upon.

Figure 16:
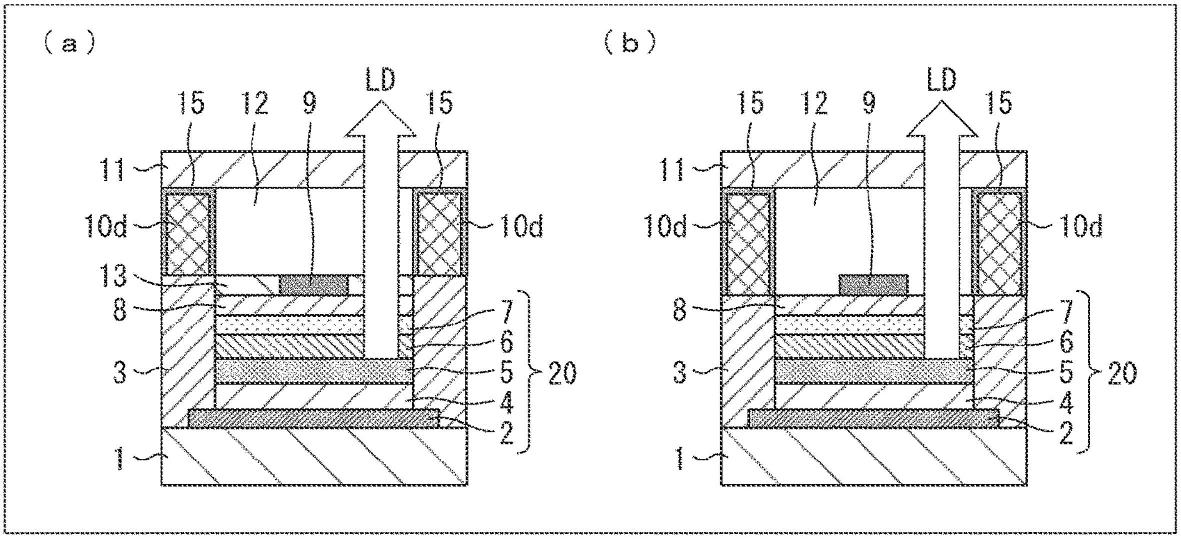
FIG. 16(*a*) is a cross-sectional view of a display region of a display device according to a fifth embodiment, and FIG. 16(*b*) is a cross-sectional view of a display region of a modification of the display device according to the fifth embodiment.

FIG. 16(*a*) is a cross-sectional view of a display region of a display device according to a fifth embodiment, and FIG. 16(*b*) is a cross-sectional view of a display region of a modification of the display device according to the fifth embodiment.

As illustrated in FIG. 16 (*a*), the display device of the fifth embodiment includes the bank 3 that covers an end portion of the first electrode 2 that reflects visible light. The light-blocking layer 10*d* has the material 15 formed on the upper surface of the bank 3 to absorb visible light. That is, the bank 3 is raised sufficiently high to come into contact with the sealing glass 11. The light-blocking layer 10*d* has the material 15 formed on the upper surface of the bank 3 to absorb visible light. Note that the material 15 that absorbs visible light may be, for example, a negative photosensitive resin containing carbon black.

Such a feature eliminates the need of aligning the bank 3 and the light-blocking layer 10*d*.

Note that the modification of the display device according to the fifth embodiment illustrated in FIG. 16(*b*) differs from the display device according to the fifth embodiment illustrated in FIG. 16(*a*) in that the modification omits the transparent plate 13.

Sixth Embodiment

Described next is a sixth embodiment of the disclosure, with reference to FIG. 17. A display device 30*d* of this embodiment differs from the display devices described in the first to fifth embodiments in that the display device 30*d* includes a light-blocking layer 10*e* provided only around a subpixel in a specific color. Otherwise, the display device 30*d* of this embodiment is the same as the display devices of the first to fifth embodiments. For convenience in description, like reference signs designate identical constituent features throughout the drawings between this embodiment and the first to fifth embodiments. These constituent features will not be elaborated upon.

Figure 17:
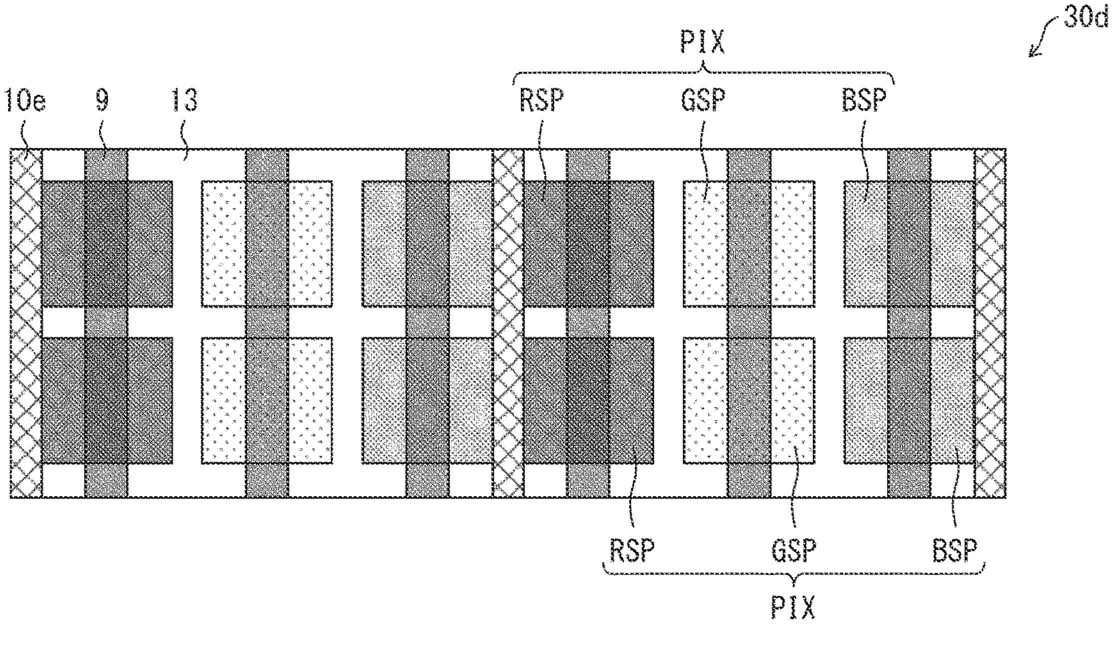
FIG. 17 is a plan view of a display region of a display device according to a sixth embodiment.

FIG. 17 is a plan view of the display region DA of the display device 30*d* according to the sixth embodiment.

As illustrated in FIG. 17, the light-blocking layer 10*e* included in the display device 30*d* is provided only around subpixels in specific colors, that is, the red subpixel RSP and the blue subpixel BSP. This embodiment exemplifies a case where the light-blocking layer 10*e* is provided only around the red subpixel RSP and the blue subpixel BSP. However, the light-blocking layer 10*e* shall not be limited to such a case.

Note that, in the display device 30*d*, the polarizing plate 9 may be formed to cover the entire pixel PIX other than a right end and a left end of the pixel PIX. This is because the right end and the left end of the pixel PIX are shadow regions of the light-blocking layer 10*e*, and the polarizing plate 9 does not have to be provided to such shadow regions.

Seventh Embodiment

Described next is a seventh embodiment of the disclosure, with reference to FIG. 18. A display device according to this embodiment differs from the display devices according to the first to sixth embodiments in that the former display device includes a light-emitting element 20*a* of a bottom emission type. Otherwise, the display device of this embodiment is the same as the display devices of the first to sixth embodiments. For convenience in description, like reference signs designate identical constituent features throughout the drawings between this embodiment and the first to sixth embodiments. These constituent features will not be elaborated upon.

Figure 18:
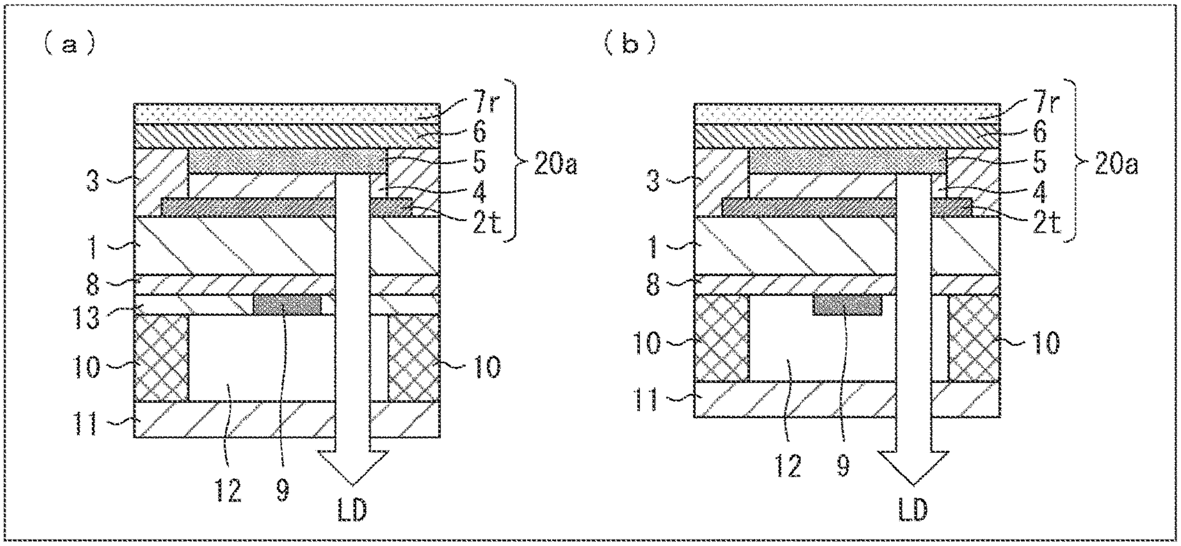
FIG. 18(*a*) is a cross-sectional view of a display region of a display device according to a seventh embodiment, and FIG. 18(*b*) is a cross-sectional view of a display region of a modification of the display device according to the seventh embodiment.

FIG. 18(*a*) is a cross-sectional view of a display region of the display device according to the seventh embodiment, and FIG. 18(*b*) is a cross-sectional view of a display region of a modification of the display device according to the seventh embodiment.

As illustrated in FIG. 18(*a*) and FIG. 18(*b*), the light-emitting element 20*a* is a bottom-emission light-emitting element.

As illustrated in FIG. 18(*a*) and FIG. 18(*b*), if the light-emitting element 20*a* has a multilayer film of a forward-order stack structure, that is, when the anode, the hole transport layer 4, the light-emitting layer 5, the electron transport layer 6, and the cathode are stacked on top of another in this order from toward the substrate 1, the anode is disposed above the cathode. Hence, in order to form the light-emitting element 20*a* as a bottom-emission light-emitting element, a first electrode 7*r* reflective to visible light may serve as the cathode, and a second electrode 2*t* transparent to visible light may serve as the anode. Meanwhile, although not shown, if the light-emitting element 20*a* has a multilayer film of a reverse-order stack structure, that is, when the cathode, the electron transport layer 6, the light-emitting layer 5, the hole transport layer 4, and the anode are stacked on top of another in this order from toward the substrate 1, the anode is disposed above the cathode. Hence, in order to form the light-emitting element 20*a* as a bottom-emission light-emitting element, the first electrode 7*r* reflective to visible light may serve as the anode, and the second electrode 2*t* transparent to visible light may serve as the cathode. As can be seen, the light-emitting element 20*a* is a bottom-emission light-emitting element, and the light emission direction LD in which light is emitted from the light-emitting element 20*a* is downward direction as illustrated in FIG. 18(*a*) and FIG. 18(*b*).

Note that the modification of the display device according to the seventh embodiment illustrated in FIG. 18(*b*) differs from the display device according to the seventh embodiment illustrated in FIG. 18(*a*) in that the modification omits the transparent plate 13.

SUMMARY

First Aspect

A display device including: a light-emitting element provided on a substrate, and including a first electrode that reflects visible light, a second electrode that transmits visible light, and a light-emitting layer provided between the first electrode and the second electrode;

- a subpixel that is a light-emitting region in plan view of the light-emitting element;
- a polarizing plate provided on the light-emitting element disposed in a light emission direction in which light is emitted from the light-emitting element, the polarizing plate partially overlapping with the subpixel in plan view; and
- a light-blocking layer provided at least partially around the subpixel and raised higher in the light emission direction than the polarizing plate.

Second Aspect

The display device according to the first aspect, wherein the light-blocking layer includes a first light-blocking wall formed linearly and a second light-blocking wall formed linearly, the first light-blocking wall and the second light-blocking wall being formed respectively along two opposing sides of the subpixel.

Third Aspect

The display device according to the second aspect, wherein the polarizing plate includes a linear portion positioned intermediately between the first light-blocking wall and the second light-blocking wall, the linear portion being formed apart from the light-blocking layer.

Fourth Aspect

The display device according to the first aspect, wherein the light-blocking layer includes a plurality of island-shaped light-blocking walls surrounding only corners of the subpixel.

Fifth Aspect

The display device according to the fourth aspect, wherein the polarizing plate is provided from a center of the subpixel to a plurality of end portions included in the subpixel and not covered with a corresponding one of the plurality of island-shaped light-blocking walls.

Sixth Aspect

The display device according to the first aspect, wherein the light-blocking layer is formed to surround the subpixel.

Seventh Aspect

The display device according to the sixth aspect, wherein the polarizing plate is spaced apart from the light-blocking layer, and the polarizing plate overlaps with a center portion of the subpixel in plan view.

Eighth Aspect

The display device according to any one of the first to seventh aspects, further including a transparent plate provided on the light-emitting element to surround the polarizing plate,

- wherein the light-blocking layer is provided on the transparent plate.

Ninth Aspect

The display device according to fourth or fifth aspect, wherein the subpixel is formed in a rectangular shape, and

- the plurality of island-shaped light-blocking walls are provided to respective four corners of the subpixel in the rectangular shape.

Tenth Aspect

The display device according to any one of the first to ninth aspects, further including a bank covering an end portion of either the first electrode or the second electrode,

- wherein the light-blocking layer overlaps at least partially with the bank.

Eleventh Aspect

The display device according to any one of the first to tenth aspects, wherein light-blocking layer contains a material that absorbs visible light.

Twelfth Aspect

The display device according to any one of the first to tenth aspect, further including a bank covering an end portion of either the first electrode or the second electrode,

- wherein the light-blocking layer has a material formed on an upper surface of the bank to absorb visible light.

Thirteenth Aspect

The display device according to any one of the first to twelfth aspect, wherein, wherein, when any given point of the subpixel is set as an origin, $\varphi$ is any given angle, on a plane passing through the origin, with respect to a first axis on the plane, and $\theta$ is any given angle with respect to a second axis perpendicular to the first axis in a vertical direction from the subpixel, and

- when the angle $\varphi$ varies within a range of 0° or more and 360° or less, and light the angle $\theta$ of which varies within a range of 0° or more and 60° or less is emitted toward the subpixel, the light-blocking layer creates a shadow region on the subpixel, and
- the polarizing plate is provided in a region out of the shadow region.

Fourteenth Aspect

The display device according to any one of the first to thirteenth aspect, further including a sealing layer provided to cover the polarizing plate, and to thoroughly overlap at least with the subpixel.

Fifteenth Aspect

The display device according to the fourteenth aspect, wherein, when n represents a refractive index of the sealing layer, H represents a height of the light-blocking layer, and W represents a length of a longest line among lines: on a plane on which the light-blocking layer is formed; perpendicular to the light-blocking layer and the polarizing plate; and between the light-blocking layer and the polarizing plate, the refractive index n, the height H, and the length W of the longest line are determined so that $\theta1 \leq 45°$ is satisfied where $\theta1$ is defined as $\sin\theta1 = n*\sin\theta'1$ and $0° < \theta1 < 90°$ whereas $\theta'1$ is defined as $\tan\theta'1 = W/H$ and $0° < \theta'1 < 90°$.

Sixteenth Aspect

The display device according to the fourteenth or fifteenth aspect, wherein, wherein, when n represents a refractive index of the sealing layer, H represents a height of the light-blocking layer, and L represents a width, of the subpixel, on a plane on which the light-blocking layer is formed, and the width is perpendicular to the light-blocking layer, the refractive index n, the height H, and the width L of the subpixel are determined so that $\theta2 \leq 60°$ is satisfied where $\theta2$ is defined as $\sin\theta2 = n*\sin\theta'2$ and $0° < \theta2 < 90°$ whereas $\theta'2$ is defined as $\tan\theta'2 = L/H$ and $0° < \theta'2 < 90°$.

Seventeenth Aspect

The display device according to any one of the first to sixteenth aspect, further including a quarter-wave plate provided between the light-emitting element and the polarizing plate to overlap at least with the polarizing plate.

ADDITIONALLY REMARKS

The disclosure shall not be limited to the embodiments described above, and can be modified in various manners within the scope of claims. The technical aspects disclosed in different embodiments are to be appropriately combined together to implement another embodiment. Such an embodiment shall be included within the technical scope of the disclosure. Moreover, the technical aspects disclosed in each embodiment may be combined together to achieve a new technical feature.

INDUSTRIAL APPLICABILITY

The disclosure can be applied to a display device.

The invention claimed is:

1. A display device, comprising:

a light-emitting element provided on a substrate, and including a first electrode that reflects visible light, a second electrode that transmits visible light, and a light-emitting layer provided between the first electrode and the second electrode;

a subpixel that is a light-emitting region in a plan view of the light-emitting element;

a polarizing plate provided on the light-emitting element and disposed in a light emission direction in which light is emitted from the light-emitting element, the polarizing plate partially overlapping with the subpixel in the plan view;

a quarter-wave plate provided between the light-emitting element and the polarizing plate, such that the quarter-wave plate overlaps at least with the polarizing plate; and a light-blocking layer provided at least partially around the subpixel and raised higher in the light emission direction than the polarizing plate.

2. The display device according to claim 1, wherein the light-blocking layer includes a first light-blocking wall formed linearly and a second light-blocking wall formed linearly, the first light-blocking wall and the second light-blocking wall being formed, respectively, along two opposite sides of the subpixel.

3. The display device according to claim 2, wherein the polarizing plate includes a linear portion positioned intermediately between the first light-blocking wall and the second light-blocking wall, the linear portion being formed apart from the light-blocking layer.

4. The display device according to claim 1, wherein the light-blocking layer includes a plurality of island-shaped light-blocking walls surrounding only corners of the subpixel.

5. The display device according to claim 4, wherein the polarizing plate is provided from a center of the subpixel to a plurality of end portions included in the subpixel, and is not covered with a corresponding one of the plurality of island-shaped light-blocking walls.

6. The display device according to claim 1, wherein the light-blocking layer surrounds the subpixel.

7. The display device according to claim 1, wherein the polarizing plate is spaced apart from the light-blocking layer, and the polarizing plate overlaps with a center portion of the subpixel in the plan view.

8. The display device according to claim 1, further comprising:

a transparent plate provided on the light-emitting element such that the transparent plate surrounds the polarizing plate, wherein the light-blocking layer is provided on the transparent plate.

9. The display device according to claim 4, wherein the subpixel is formed in a rectangular shape, and each of the plurality of island-shaped light-blocking walls is provided to a respective corner of the corners of the subpixel in the rectangular shape.

10. The display device according to claim 1, further comprising:

a bank covering an end portion of either the first electrode or the second electrode, wherein the light-blocking layer overlaps at least partially with the bank.

11. The display device according to claim 1, wherein the light-blocking layer contains a material that absorbs visible light.

12. The display device according to claim 1, further comprising:

a bank covering an end portion of either the first electrode or the second electrode, wherein the light-blocking layer has a material formed on an upper surface of the bank to absorb visible light.

13. The display device according to claim 1, wherein, in a case that any given point of the subpixel is set as an origin, $\varphi$ is any given angle, on a plane passing through the origin, with respect to a first axis on the plane, and θ is any given angle with respect to a second axis perpendicular to the first axis in a vertical direction from the subpixel, and in a case that the angle φ varies within a range of 0° or more and 360° or less, and light, the angle θ of which varies within a range of 0° or more and 60° or less, is emitted toward the subpixel, the light-blocking layer creates a shadow region on the subpixel, and the polarizing plate is provided in a region outside of the shadow region.

14. The display device according to claim 1, further comprising:

a sealing layer that covers the polarizing plate, and that thoroughly overlaps with at least the subpixel.

15. The display device according to claim 14, wherein n represents a refractive index of the sealing layer, H represents a height of the light-blocking layer, and W represents a length of a longest line among a first line on a plane on which the light-blocking layer is formed, a second line perpendicular to the light-blocking layer and the polarizing plate, and a third line between the light-blocking layer and the polarizing plate, wherin the refractive index n, the height H, and the length W of the longest line are determined so that $\theta_1 \leq 45°$ is satisfied, where $\theta_1$ is defined as $\sin \theta_1 = n^* \sin \theta'_1$ and $0° < \theta_1 < 90°$, and $\theta'_1$ is defined as $\tan \theta'_1 = W/H$, and $0° < \theta'_1 < 90°$.

16. The display device according to claim 14, wherein n represents a refractive index of the sealing layer, H represents a height of the light-blocking layer, and L represents a width, of the subpixel, on a plane on which the light-blocking layer is formed, and the width is perpendicular to the light-blocking layer, wherein the refractive index n, the height H, and the width L of the subpixel are determined so that $\theta_2 \geq 60°$ is satisfied, where $\theta_2$ is defined as $\sin \theta_2 = n^* \sin \theta'_2$ and $0° < \theta_2 < 90°$, and $\theta'_2$ is defined as $\tan \theta'_2 = L/H$, and $0° < \theta'_2 < 90°$.

17. A display device, comprising:

a light-emitting element provided on a substrate, and including a first electrode that reflects visible light, a second electrode that transmits visible light, and a light-emitting layer provided between the first electrode and the second electrode;

a subpixel that is a light-emitting region in a plan view of the light-emitting element;

a polarizing plate provided on the light-emitting element disposed in a light emission direction in which light is emitted from the light-emitting element, the polarizing plate partially overlapping with the subpixel in the plan view; and a light-blocking layer provided at least partially around the subpixel and raised higher in the light emission direction than the polarizing plate, wherein:

the light-blocking layer includes a plurality of island-shaped light-blocking walls surrounding only corners of the subpixel, the polarizing plate is provided from a center of the subpixel to a plurality of end portions included in the subpixel, and the polarizing plate is not covered with a corresponding one of the plurality of island-shaped light-blocking walls.

18. A display device, comprising:

a light-emitting element provided on a substrate, and including a first electrode that reflects visible light, a second electrode that transmits visible light, and a light-emitting layer provided between the first electrode and the second electrode;

a bank covering an end portion of either the first electrode or the second electrode;

a subpixel that is a light-emitting region in a plan view of the light-emitting element;

a polarizing plate provided on the light-emitting element disposed in a light emission direction in which light is emitted from the light-emitting element, the polarizing plate partially overlapping with the subpixel in the plan view; and a light-blocking layer provided at least partially around the subpixel and raised higher in the light emission direction than the polarizing plate, wherein the light-blocking layer has a material formed on an upper surface of the bank to absorb visible light.

* * * * *